Nov. 26, 1963 R. STEINHOFF 3,112,454

NEGATIVE CONDUCTANCE AMPLIFIER

Filed Nov. 23, 1959 3 Sheets-Sheet 1

INVENTOR.
Reynold Steinhoff

BY Eugene M. Whitacre

Attorney

Nov. 26, 1963 R. STEINHOFF 3,112,454

NEGATIVE CONDUCTANCE AMPLIFIER

Filed Nov. 23, 1959

3 Sheets-Sheet 2

INVENTOR.
Reynold Steinhoff

By Eugene M. Whitacre

Attorney

Nov. 26, 1963 R. STEINHOFF 3,112,454

NEGATIVE CONDUCTANCE AMPLIFIER

Filed Nov. 23, 1959

3 Sheets-Sheet 3

INVENTOR.
Reynold Steinhoff

BY Eugene M. Whitacre

Attorney

United States Patent Office 3,112,454
Patented Nov. 26, 1963

3,112,454
NEGATIVE CONDUCTANCE AMPLIFIER
Reynold Steinhoff, Livingston, N.J., assignor to Radio Corporation of America, a corporation of Delaware
Filed Nov. 23, 1959, Ser. No. 854,953
9 Claims. (Cl. 330—61)

This invention relates to high frequency signal translating systems, and more particularly to high frequency amplifying circuits including negative resistance devices.

In an amplifier circuit including a negative resistance device as the active circuit element thereof, the total positive conductance of the signal source and load circuits must be selected so that the combination thereof with the negative conductance of the device produces a resultant positive conductance. If a resultant negative conductance is produced, the circuit tends to oscillate. In general, the signal source circuit conductance, the load circuit conductance and the negative resistance device conductance are functions of frequency. Thus, although the various conductances satisfy the conditions for amplification over a desired frequency band, at some frequencies outside of the desired frequency band the combination of these conductances may produce a resultant negative conductance which causes instability as evidenced by spurious or parasitic oscillation. Such instability detrimentally affects the operation of an amplifier circuit.

It is accordingly an object of this invention to provide an improved high frequency signal translating system of the type including a negative resistance device as the active element thereof.

It is another object of this invention to provide an improved high frequency amplifier of the type using a negative resistance device which is not subject to spurious oscillation outside of the amplifier frequency passband.

A high frequency amplifier in accordance with the invention includes a negative resistance device, such as a negative resistance diode, coupled to suitable signal source and load circuits. The negative resistance device is also coupled to frequency responsive means which may include a resonant transmission line structure or its equivalent. Where the negative resistance device is of the voltage controlled type, the frequency responsive means is connected in parallel with the device and is selected: (1) to present a positive conductance that exceeds the absolute value of the negative conductance of the device for frequencies outside of the desired amplifier passband; and (2) is less than the negative conductance of the device for frequencies falling within the amplifier passband. The combination of the negative resistance device and the frequency responsive means provides a resultant positive conductance for frequencies outside of the amplifier passband, and, therefore, parasitic oscillations do not occur. Within the amplifier passband this combination exhibits a resultant negative conductance to the signal input and output circuits so that amplification can be obtained. Where current controlled negative resistance devices are used, the circuit is the dual of the circuit including the voltage controlled device. In such a case, the positive resistance of the frequency responsive means connected in series with the device is selected to exceed the negative resistance of the device for frequencies outside of the amplifier passband and to be less than the negative resistance of the device for signal frequencies within the amplifier passband.

A frequency responsive means for producing the aforementioned characteristic may comprise a properly loaded electrical resonator means, such as, for example, a transmission line or its equivalent, which is resonant at the center frequency of the amplifier passband. With a negative resistance device connected to such a resonator means, the susceptance of the device and the susceptance of the resonator means produce phase shifts in the applied signal which may result in reflected waves which are of a phase to interfere with or cancel the signal voltage across the negative resistance device, thereby preventing efficient amplification. To prevent improper phase shifts of this type, second resonator means is coupled to the first resonator means at a position adjacent the negative resistance device connection. The second resonator means is selected to resonate with the combined susceptance of the negative resistance device and first resonator means at the desired frequency of amplification.

The novel features that are considered to be characteristic of this invention are set forth with particularity in the appended claims. The invention itself, however, both as to its organization and method of operation as well as additional objects and advantages thereof, will best be understood from the following description when read in connection with the accompanying drawings, in which:

The principles of the present invention are particularly, although not exclusively, applicable to signal translating systems using negative resistance diodes. Negative resistance diodes may be divided into two general categories: current controlled negative resistance diodes, an example of which is described in Shockley U.S. Patent 2,855,524; and voltage controlled negative resistance diodes, an example of which is described by H. S. Sommers, "Proceedings of the IRE," July 1959, pages 1201–1205.

Figure 1:
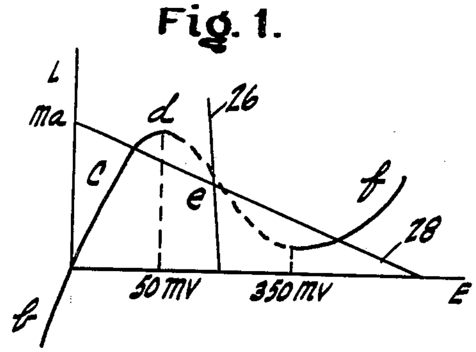
FIGURE 1 is a graph illustrating the current-voltage characteristic of a voltage controlled negative resistance diode.

The current-voltage characteristic of a typical voltage controlled negative resistance diode suitable for use in amplifying circuits embodying the invention is shown in FIGURE 1. The current scales depend on the area and doping of the diode junction, but representative currents are in the milliampere range. For a small voltage in the back direction, the back current of the diode increases as the reverse bias voltage is increased as indicated by the region *b* of FIGURE 1. This increased back current is thought to be due to an increase in quantum mechanical tunneling current.

For small forward bias voltages, the characteristic is substantially symmetrical with region *b* (FIGURE 1, region *c*). The forward current is believed to result due to a reduction in the reverse quantum mechanical tunneling current. At higher forward bias voltages, about 50 millivolts (mv.), the forward current reaches a maximum (region *d*, FIGURE 1), and then begins to decrease. This drop continues (FIGURE 1, region *e*) until eventually at about 350 mv., normal injection over the barrier becomes important and the characteristic turns into the usual forward behavior (region *f*, FIGURE 1).

Figure 2:
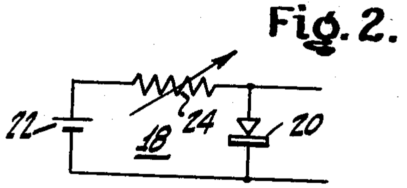
FIGURE 2 is a schematic circuit diagram of a D.-C. biasing circuit for the diode of FIGURE 1.

The negative resistance of the diode is the incremental change in voltage divided by the incremental change in current, or the reciprocal slope of the region *e* of FIGURE 1. To bias the diode for stable operation in the negative resistance region of its characteristic requires a suitable voltage source having a smaller internal impedance than the negative resistance of the diode. As shown in FIGURE 2, the voltage source 18 may comprise a battery 22 and a variable resistor 24, with the internal resistance of the source 18 being the sum of the internal resistance of the battery 22 and the adjusted resistance of the variable resistor 24. Such a voltage source has a D.-C. load line 26 as indicated in FIGURE 1, which is characterized by a current-voltage relationship which has a greater slope than the negative slope of the diode characteristic and intersects the diode characteristic at only a single point. If the voltage source 18 has an internal resistance which is greater than the negative resistance of the diode, the source would have a load line 28 with a smaller slope than the negative slope of the diode characteristic as indicated in FIGURE 1, and would intersect the diode characteristic curve at three points. Under the latter conditions the diode is not stably biased in the negative resistance region. This lack of stability is because an incremental change in current through the diode due to transient or noise currents, or the like, produces a regenerative reaction which causes the diode to assume one of its two stable states represented by the intersection of the load line 28 with the positive resistance portions of the diode characteristic curve.

Figure 3:
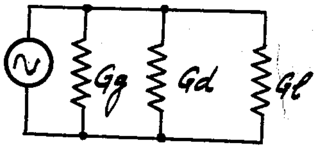
FIGURE 3 is an equivalent circuit diagram of a two terminal negative resistance signal translating stage.

A simplified alternating current (A.-C.) circuit diagram of a two terminal negative resistance amplifier circuit is shown in FIGURE 3. The negative resistance diode is represented as an equivalent conductance $-G_d$ and is stably biased in the negative resistance region of its characteristic, preferably at the minimum negative resistance point, by a D.-C. biasing circuit, not shown. The equivalent conductance of the source and load circuits connected to the diode are indicated as $G_g$ and $G_1$ respectively.

The power gain for this circuit is equal to:

$$\frac{\text{Power out}}{\text{Power in}}$$

where Power is the maximum power that may be delivered to a load from a given generator.

Assuming optimum impedance matching between the source $G_g$ and the load $G_1$, the maximum power that may be delivered from the source $G_g$ to the load $G_1$ may be expressed:

$$\text{Power in}=E^2G_1 \tag{1}$$

Wherein E is the source voltage but $$E=\frac{I}{G_1+G_g} \tag{2}$$

Wherein I is the total current and $G_1=G_g$ for optimum matching substituting 2 in Formula 1

$$\text{Power in}=\frac{I^2}{4G_g} \tag{3}$$

The power out may be expressed:

$$\text{Power out}=E^2G_1 \tag{4}$$

but $$E=\frac{I}{G_g+G_1-G_d} \tag{5}$$

substituting 5 in Formula 4

$$\text{Power out}=\frac{I^2G_1}{(G_g+G_1-G_d)^2} \tag{6}$$

Thus $$\text{Power Gain}=\frac{\text{Power out}}{\text{Power in}}=\frac{\dfrac{I^2G_1}{(G_g+G_1-G_d)^2}}{\dfrac{I^2}{4G_g}}$$

$$\text{Power Gain}=\frac{4G_1G_g}{(G_g+G_1-G_d)^2} \tag{7}$$

Thus for high gain, $G_d$, the negative conductance of the diode, should approach, but be less than, the total positive conductance of the circuits, $G_g+G_1$.

In general it may be said that the conductances of the signal source circuit, the load circuit, and the negative resistance diode, are functions of frequency. Thus the circuit may be stable at some frequencies and unstable at others. For example, although the amplifier has been designed so that the circuit is stable over a predetermined desired frequency passband, the negative conductance of the diode may exceed the positive conductance of source and load circuits at frequencies outside the passband of the amplifier. Under these conditions parasitic or spurious oscillation will occur. This seriously degrades the amplifier performance, and results in distortion and loss of gain.

In accordance with the invention, stable gain may be achieved over a predetermined desired frequency passband by introducing a frequency dependent conductance device into the negative resistance diode circuit. The frequency dependent conductance device is selected so that the conductance thereof exceeds the negative conductance of the negative resistance diode for frequencies outside the amplifier frequency passband, and the conductance of the frequency dependent device approaches zero within the amplifier passband.

Figure 4:
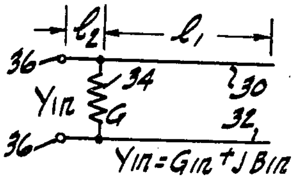
FIGURE 4 is a diagrammatic representation of a resonant transmission line structure for use with high frequency amplifying circuits embodying the invention.

A frequency dependent conductance device having these properties may comprise a resonant transmission line of the type diagrammatically represented in FIGURE 4. In this figure, a resonant transmission line structure includes a pair of parallel conductors 32 and 30. A noninductive resistor 34 of low resistance, such as a slab of germanium or graphite $G_r$, is connected between the conductors 32 and 30 near the end thereof provided with a pair of input terminals 36. The length $l_1$ of conductors 32 and 30 between the resistor 34 and the open circuited ends of the line is selected to be a quarter wave length at the desired center frequency of the amplifier passband, and the length $l_2$ between the resistor 34 and the terminals 36 is very much smaller than the length $l_1$. The input admittance $Y_{in}$ of the transmission line structure looking into the terminals 32, has a real component $G_{in}$ and imaginary component $_jB_{in}$.

Figure 5:
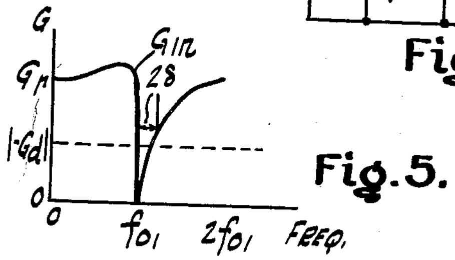
FIGURE 5 is a graph illustrating the input conductance characteristic of the transmission line structure shown in FIGURE 4.

If the conductance of the resistor 34 is made larger than the absolute value of the negative conductance of a diode to be connected between the terminals 36, then the structure shown in FIGURE 4 will satisfy the conditions that the positive conductance thereof will exceed that of the negative conductance of the diode for frequencies outside of the amplifier passband and will exhibit a substantially zero conductance for signal frequencies within the amplifier passband. The real component, i.e., conductance, of the transmission line admittance plotted against frequency is shown in the graph of FIGURE 5. At zero frequency, the input conductance of the transmission line structure of FIGURE 4 is equal to the conductance of the resistor 34 or $G_r$, which in the present case is selected to match the characteristic impedance $G_0$, of the quarter wave section $l_1$. The conductance $G_r$ is greater than the absolute value of the negative conductance of the diode to be used as indicated in FIGURE 5 by the dashed line labeled $-G_d$. For input signal frequencies corresponding to the frequency of resonance $f_{01}$ of the quarter wave transmission line section $l_1$, a voltage minimum occurs across the terminals of the resistor 34. Since there is a voltage minimum, minimum current flows through the resistor 34 and the effective conductance at the terminals 36 is minimum. This minimum conductance is less than the absolute value of the diode negative conductance $G_d$. Since the resistor 34 matches the impedance $G_0$ of the transmission line structure (all of conductors 32 and 30), the length $l_2$ of the conductors 32 and 30 has substantially no effect on the input conductance of the transmission line. As the signal input frequency is increased above the frequency $f_{01}$, the input conductance of the transmission line again increases to the maximum with a sharp minimum occurring at every odd harmonic of the frequency $f_{01}$. By selecting a negative resistance diode which has a cut-off frequency below the third harmonic of $f_{01}$ it was found that no difficulty was experienced with parasitic oscillations.

Figure 6:
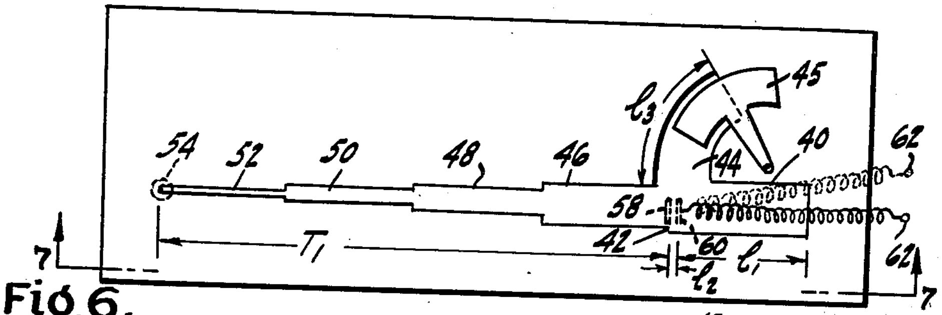
FIGURE 6 is a plan view of a resonant transmission line structure used in high frequency amplifier circuits embodying the invention.
Figures 7, 9:
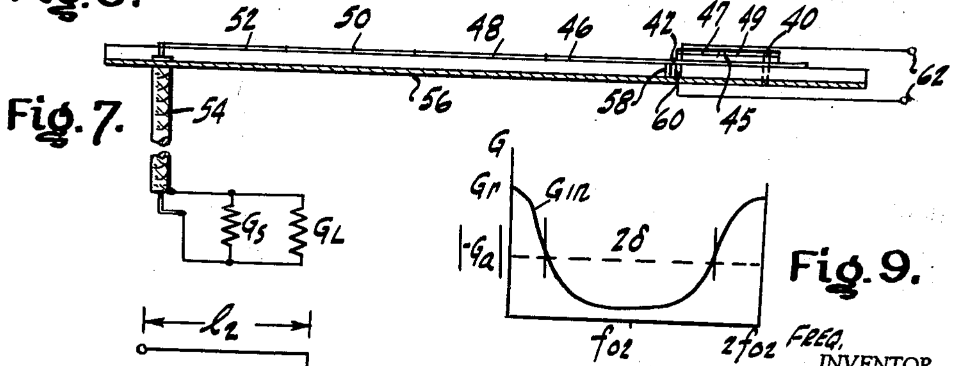
FIGURE 7 is a sectional view of the transmission line structure shown in FIGURE 6 taken on section lines 7—7.
FIGURE 9 is a graph showing the input conductance of the transmission line structure shown in FIGURE 8.

A physical exemplification of a transmission line structure of the type described is shown in FIGURES 6 and 7. This transmission line structure may comprise symmetrical parallel conductors or a single conductor spaced from a ground plane. The latter configuration is shown in FIGURES 6 and 7. This transmission line structure, which was used in a negative resistance amplifier operating in the range of 400 megacycles/second, comprises three elements. The first of these elements is a conductor section 40 having a length $l_1$, which corresponds to the length $l_1$, shown in FIGURE 4. The second element is a conductor section 42 having a length $l_2$ which corresponds to the length $l_2$ shown in FIGURE 4. The third element is a tuning stub 44 of conductive material which is provided for tuning out the susceptances presented by the negative resistance diode and the conductor section 42 as will be described hereinafter. The transmission line structure is connected by an impedance transformer comprising a series of conductive sections 46, 48, 50 and 52 of decreasing width and a coaxial transmission line 54, to suitable amplifier input and output circuits, represented by the conductances $G_s$ and $G_1$. The sections 46–52 are stepped in width to provide a smooth impedance transformation over a wide band of frequencies.

The transmission line structure and impedance transformer may comprise a single continuous sheet of conductive material which is insulated and spaced from a ground plane member 56 which comprises a rectangular sheet of conductive material. A negative resistance diode 58 is connected to the transmission line structure between the ground plane member 56 and the end of the conductor section 42 adjacent the impedance transformer. A non inductive resistor 60 is connected between the ground plane member 56 and the junction of the conductor sections 40 and 42 thereof.

The biasing voltage for the negative resistance diode 58 is supplied from a regulated power supply, not shown, connected with the terminals 62. By way of example the power supply provides a regulated biasing voltage for the diode which is on the order of 130 mv. The biasing voltage is developed across the resistor 60, and the combined parallel resistance of the resistor 60 and internal resistance of the power supply is less than the absolute value of the negative resistance of the diode so that the diode will be stably biased. If desired, suitable isolating means such as a radio frequency choke coil (indicated) may be provided in series with the power supply connections to keep the low power supply resistance from loading the amplifier. To provide further isolation, the power supply is connected to the transmission line structure adjacent the noninductive resistor 60 which is at a voltage minimum at amplifier operating frequencies in the passband. This has the advantage of suppression of parasitic oscillation which might occur as is described in the copending application of H. S. Sommers entitled "Negative Resistance Diode Circuit" filed July 7, 1959, Serial No. 825,483.

As shown in FIGURE 5, the transmission line structure presents a greater positive conductance than the absolute value of the conductance of the diode for all frequencies except where the transmission line conductance curve drops to a minimum at the resonant frequency of the transmission line and odd harmonics thereof. This means that the combination of the diode and the transmission line structure does not provide a resultant or net negative conductance except near the resonant frequency of the transmission line section $l_1$ or odd harmonics thereof. The circuit is so designed that the signal source and load conductances exceed the negative conductance of the diode by a small amount to provide amplification at the frequency $f_{01}$. The transmission line characteristic determines the amplifier frequency passband which is indicated by $2\delta$ of FIGURE 5. As a practical matter the diode is selected so that it cannot oscillate at frequencies above the second harmonic so that parasitic oscillation cannot take place at third or higher odd harmonics of the frequency $f_{01}$.

The diode 58 has capacitance across its junction which is presented between the conductors of the transmission line structure. Furthermore the conductor section 42, length $l_2$, has reactance which is present in the circuit. Although the conductor section 40 of the transmission line is matched to its load $G_1$, the reactive or susceptance elements of the diode 58 and conductor section 42 may cause phase shifts which adversely affect the amplifier operation, by causing the signal across the diode 58 to be phase shifted in such a manner that the signal is reflected from the open end of the transmission line back to the diode in a phase which tends to cancel the signal voltages thereacross. If the negative susceptance (capacitance) presented by the diode 58 is equal to the positive susceptance (inductance) of the conductor section 42 then these susceptances balance out and the reflections would be in the proper phase to obtain efficient amplification. However, as a practical matter, it is very difficult to adjust or design these elements to provide equal and opposite susceptance values and therefore means are provided for preventing undesirable signal wave reflection due to the phase shifts produced by these susceptances from adversely affecting the amplifier operation.

Further in accordance with the invention, a tuning stub 44, of length $l_3$ is connected to the conductor sections 40 and 42 at point adjacent the diode 58. The length $l_3$ of the tuning stub 44 is selected to resonate at the amplifier frequency with the susceptances in the circuit introduced by the diode 58 and the conductor section 42. The effective length of the tuning stub 44 may be varied by changing the position of a rotatable conductive tuning member 45 which is in variable contacting registry with the tuning stub 44. The tuning member 45 is supported by an insulating support 47 which has an arm 49 that is pivotally mounted on the insulating support of the transmission line structure. When the incidental susceptances are tuned out, the reflections of the signal voltage down the transmission line are in phase with the input signal voltage applied to the diode 58 thereby enabling efficient amplifier operation.

Figure 8:
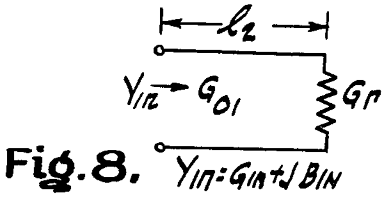
FIGURE 8 is a diagrammatic representation of another form of transmission line structure embodying the invention.
Figure 10:
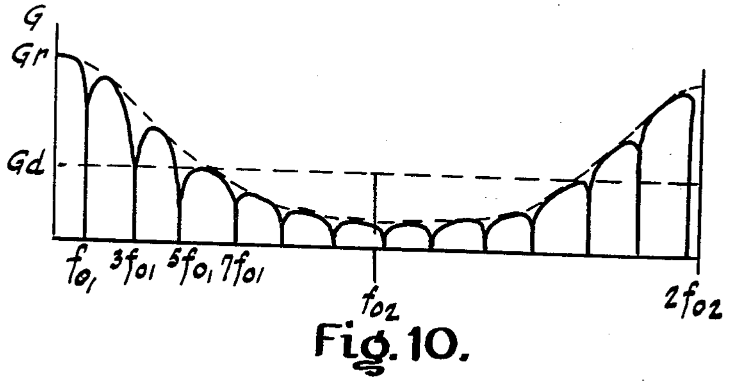
FIGURE 10 is a graph illustrating the input conductance of the transmission line structure shown in FIGURE 4 when the transmission line characteristic impedance is mismatched to its load.

If the transmission line structure is mismatched to its load, such as when the conductance value of the resistor 34 is larger than the characteristic admittance $G_0$ of the transmission line, then the resultant input conductance characteristic will appear as shown in FIGURE 10. As shown, the input conductance decreases to a minimum at the odd harmonics $f_{01}$ of the resonant frequency of the quarter wave conductor section 40 represented by the length $l_2$ of FIGURES 4 and 6. However, because of the mismatched condition, the envelope of the transmission line conductance decreases to a minimum at a frequency $f_{02}$. The frequency $f_{02}$ is the resonant frequency of the quarter wave transmission line conductor section 42. To eliminate the dips in the input conductance which occur at the odd harmonics of the resonant frequency $f_0$ portion of the conductor section 40, the conductor section 40 may be removed as shown in FIGURE 8. The structure of FIGURE 8 has an input conductance characteristic as shown in the graph of FIGURE 9. It will be noted that the frequency band-pass characteristic corresponding to the frequency band $2\Delta$, of an amplifier circuit using such a structure has been considerably widened.

Figure 11:
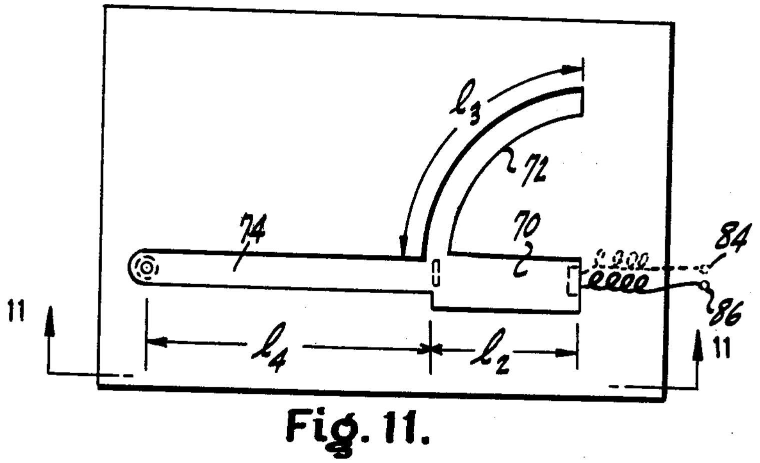
FIGURE 11 is a plan view of a resonant transmission line structure for high frequency amplifier circuits embodying the invention.
Figure 12:
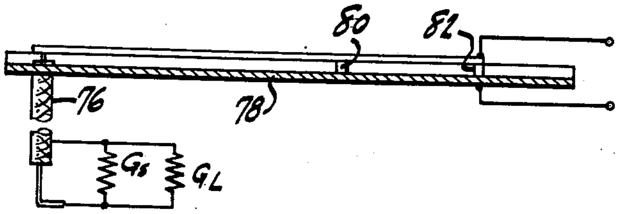
FIGURE 12 is a sectional view of the transmission line structure shown in FIGURE 11 taken on section lines 11—11.

A physical exemplification of a structure for producing the input conductance characteristic of FIGURE 9 is shown in FIGURES 11 and 12. In these FIGURES, the length $l_2$ of a conductor section 70 corresponds to the length $l_2$ of the parallel conductors shown in FIGURE 8. A tuning stub 72 having a length $l_3$ is provided for tuning out the residual susceptances present in the circuit which are primarily due to the negative resistance diode 80. If desired, a variable tuning element similar to the element 45 of FIGURE 6 may be added to adjust the effective length of the tuning stub 72. An impedance matching line section 74 having a length $l_4$ is provided to couple the transmission line conductor section 70 to a coaxial transmission line 76 which in turn is connected to the source and load circuits for the amplifier.

The transmission line structure shown in FIGURES 11 and 12 is similar to that shown in FIGURES 6 and 7 in that the sections 70, 72, 74 comprise a substantially continuous conductive sheet which is spaced from a conductive ground plane of rectangular configuration 78 by a suitable insulating material. The negative resistance diode 80 and a non-inductive resistor which may comprise a slab of germanium 82 are connected between the ground plane and the conductor section 70 at opposite ends thereof. The diode 80 is biased to the desired point in its operating characteristic, so that the diode exhibits a stable negative resistance, by a suitable power supply, not shown, which is connected to a pair of terminals 84 and 86. As mentioned above in connection with FIGURE 6, the power supply is connected between the ground plane and the conductor section 70 adjacent the non-inductive resistor 82.

The conductor section 70 is made a quarter-wave length long for the mid-band frequency of the amplifier. The characteristic admittance of this section is indicated as $Y_{in}$ in FIGURE 8 of the drawings. In order that there exists an amplifying region shown as $2\Delta$ in FIGURE 9, the characteristic impedance of the conductor section 70, $$G_{01} < \sqrt{G_d G_r}$$

The precise values used will in turn define the upper and lower frequency limits of amplification. For stability outside of the amplifying region, the further relationship $|-G_d| < G_r$ must also be satisfied.

Figures 13, 14:
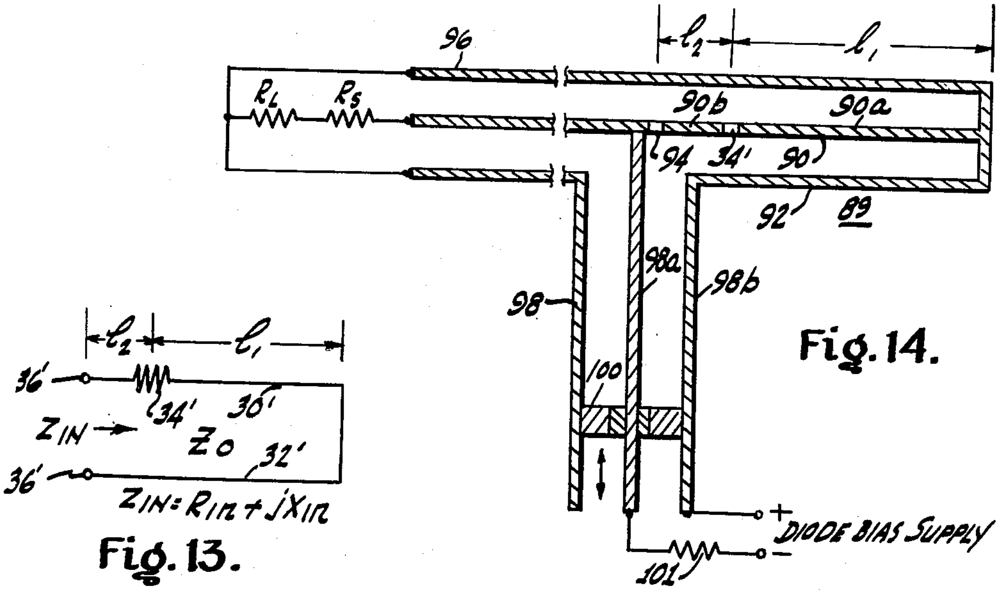
FIGURE 13 shows diagrammatically a modification of the structure shown in FIGURE 4 for use with current controlled negative resistance diodes.
FIGURE 14 is a diagrammatic sectional view of a coaxial transmission line amplifying system in accordance with the invention.

High frequency amplifiers may employ current controlled negative resistance devices as shown in FIGURES 13 to 16. In general these circuits are the duals of those shown and described heretofore. For example FIGURE 13 is a diagrammatic representation of a transmission line structure using a current controlled negative resistance diode, which is the dual of the structure of FIGURE 4. As shown in FIGURE 13 the transmission line comprises a pair of parallel conductors 30′ and 32′ having a pair of sections of length $l_1$ and $l_2$ respectively. A resistor 34′ of small physical length is inserted in series with the conductor 30′. The resistance value of the resistor 34′ is selected to be greater than the negative resistance of a current controlled negative resistance diode to be connected in series with one of the conductors 30′ and 32′ adjacent the input terminals 36′. When the characteristic impedance of the shorted quarter wave transmission line section represented by the length $l_1$ is matched to its load, then the section represented by the length $l_2$ has little effect on the input resistance for any frequency. The input resistance at the terminals 36′ is represented by the graph of FIGURE 5, it being understood that the ordinate is now to be read in terms of resistance rather than conductance as shown. In other words $G_r$ of FIGURE 5 represents the resistance of the resistor 34′, $|-G_d|$ represents the absolute value of the negative resistance of the diode, and $G_{in}$ represents the input resistance between the terminals 36′.

From FIGURE 5, it can be seen that the positive resistance of the transmission line structure exceeds the absolute value of the negative resistance of the diode $R_d$ for all frequencies except at the frequency of resonance $f_{01}$ of the shorted quarter wave transmission line section, $l_1$, and third harmonics thereof. Since the resistor 34′ is in series with the diode, then the combination of the transmission line structure and the diode can present a negative resistance to the source and load circuits only at frequencies in the range of frequency $f_{01}$. As mentioned hereinbefore, the cutoff frequency of the diode selected for use with a circuit of the type described, may be sufficiently low so that spurious or parasitic oscillation is not produced at third harmonics of $f_{01}$.

A circuit including a current controlled negative resistance diode may include a coaxial resonant transmission line 89 as shown in FIGURE 14. The coaxial transmission line has an inner conductor 90, and an outer conductor 92 which may be of cylindrical configuration. The inner conductor 90, has conductor sections 90*a* and 90*b* of lengths $l_1$ and $l_2$ respectively, which correspond to the lengths of the conductor sections $l_1$ and $l_2$ shown in FIGURE 13.

The resistor 34′ is inserted in the center conductor 90 between the sections 90*a* and 90*b*, and the current controlled negative resistance diode 94 is inserted in series with the center conductor 90 at the remote end of the section 90*b*. A suitable coupling device such as a coaxial line 96 of the proper impedance to match the characteristic impedance of the quarter-wave section $l_1$, is provided to couple the resonant transmission line 90 to signal source and load circuits represented as the resistances $R_s$ and $R_l$ respectively. It will be noted that for the current controlled negative resistance diode, the effective resistances of the source and load circuits are connected in series with the diode.

To prevent phase shifts of the signal in the resonant transmission line 90 which cause reflected signals of a phase to interfere with efficient amplification of the applied signal, the residual reactances in the circuit must be tuned out. These reactances are primarily due to the effective series inductance of the diode, and the shunt capacitance introduced primarily by the line section $l_2$. A tuning stub 98 comprising a coaxial line section having its center conductor connected to the center conductor 90 adjacent the position of the diode 94, is provided to tune out the residual reactances. If desired the tuning stub may include a capacitive shorting member 100 to permit convenient changing of the effective length of the tuning stub 98.

Since the tuning stub is capactively shorted, the inner and outer conductors 98*a* and 98*b* thereof may be used as the circuit path for the biasing current for the diode 94. The series resistance represented by the resistor 101 of the biasing current source (not shown) must be larger than the absolute value of the negative resistance of the diode 94 for stable biasing in the negative resistance region of the diode characteristic. To prevent the source and load circuits from shunting the biasing supply source, the coaxial line 96 may be capacitively coupled to the resonant transmission line structure.

For amplification, the resistances of the signal source and load circuits are selected to exceed the absolute valve of the diode negative resistance by a slight amount, for signal frequencies within the amplifier frequency bandpass. At frequencies outside of the amplifier bandpass a net positive resistance is presented to the source and load circuits so that parasitic oscillations will not occur.

If the impedance of the circuits connected across the terminals 36' is greater than the characteristic impedance $Z_0$, of the line section $l_1$, then the input resistance characteristic is represented in FIGURE 10. In the case of the current controlled device, as mentioned above, the ordinate values should be read in terms of resistance. Here, as in the case of the structure of FIGURE 8, the envelope drops to a minimum at a frequency $f_{02}$, where the line section $l_2$ appears as a quarter wave line due to the mismatch of the transmission line with the circuits connected therewith. The dips occurring at the frequency $f_{01}$ and third harmonics thereof can be eliminated by removing the section of the transmission line corresponding to the length $l_1$, as is shown in FIGURES 15 and 16.

Figures 15, 16:
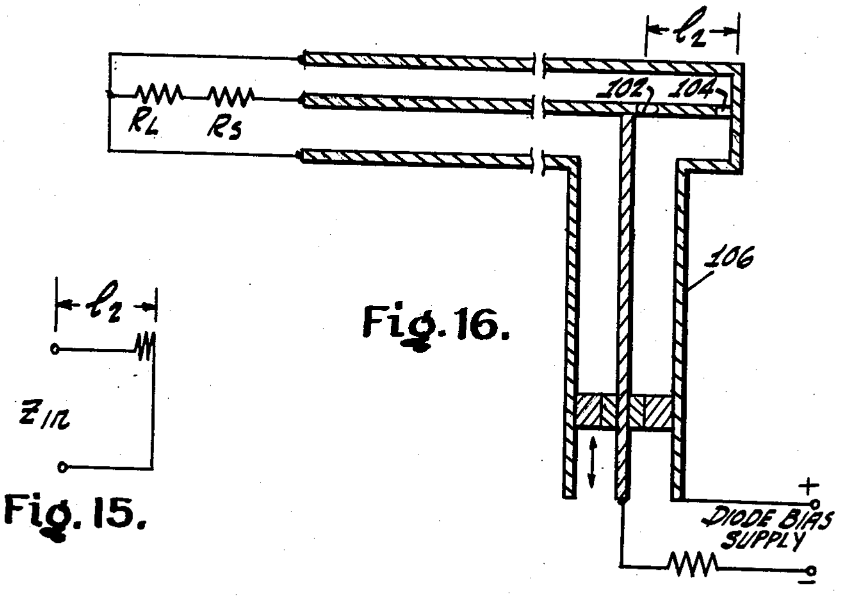
FIGURE 15 shows diagrammatically a modification of the structure shown in FIGURE 8 for use with current controlled negative resistance diodes.
FIGURE 16 is a diagrammatic sectional view of a coaxial transmission line amplifying system embodying the invention.

The input resistance characteristic of the resonant structure of FIGURES 15 and 16 is shown in the graph of FIGURE 9. The center frequency of the amplifier passband for the structure of FIGURE 16 is the frequency of resonance of the shorted quarterwave line section of length $l_2$. The amplifier of FIGURE 16 includes a current controlled negative resistance diode 102, and a non-capacitive resistor 104. The absolute value of the diode negative resistance is selected to be less than the resistance of the resistor 104. Thus, the amplifier will be stable at frequencies outside of the amplifier passband, and not subject to parasitic or spurious oscillation. The residual reactance in the circuit primarily due to the diode may be tuned out by an adjustable tuning stub 106.

What is claimed is:

1. In an electrical circuit the combination comprising, a transmission line section having a pair of parallel conductors, resistive means connected between the conductors of said transmission line section at one end thereof, a negative resistance device connected between the conductors of said transmission line section at the other end thereof, and means for tuning said circuit connected to the conductors of said transmission line section adjacent the connection of said device.

2. An electrical circuit comprising in combination a negative resistance diode, biasing circuit means for said diode including a stabilizing resistor across which a biasing voltage is developed, and a quarter-wave transmission line impedance transformer coupled between said diode and said resistor to apply said biasing voltage to said diode, said impedance transformer and said resistor exhibiting to said diode a conductance-frequency characteristic providing a resultant positive conductance that is less than the absolute value of the negative conductance of said diode for a band of frequencies in the operating frequency range of said circuit and a resultant positive conductance which is greater than the absolute value of the negative conductance of said diode for frequencies outside said band of frequencies.

3. An electrical circuit comprising in combination a transmission line having an electrical length substantially equal to one quarter of a wave length at the operating frequency of said circuit, a negative conductance diode coupled to one end of said transmission line, and a resistor coupled to the other end of said transmission line, the resistance of said resistor being small with respect to the characteristic impedance of said transmission line so that said resistor and said transmission line exhibit a smaller positive conductance than the absolute value of the negative conductance of said diode for a band of frequencies in the operating frequency range of said circuit and a greater positive conductance than the absolute value of the negative conductance of said diode for frequencies outside of said band of frequencies.

4. An electrical circuit comprising in combination a transmission line having an electrical length substantially equal to one quarter of a wavelength at the operating frequency of said circuit, a negative resistance diode adapted to exhibit a given absolute value of minimum negative resistance coupled to one end of said transmission line and a resistor having a resistance magnitude less than said absolute value of the negative resistance of said diode coupled to the other end of said line, said transmission line having a characteristic impedance greater than the resistance magnitude of said resistor.

5. A high frequency electrical circuit comprising in combination a transmission line open at one end, a resistor coupled to the other end of said transmission line, and a negative resistance diode coupled to said transmission line at a distance from said resistor that is substantially one quarter of a wavelength at the operating frequency of said electrical circuit.

6. A high frequency electrical circuit comprising in combination a transmission line having a resonant first section and a second section coupled together at a junction, a resistor coupled to the end of said second section, and a negative resistance diode coupled to said transmission line at the junction of said first and second sections, said second section having an electrical length that is substantially one quarter of a wavelength at the operating frequency of said electrical circuit.

7. An amplifier tunable over a broadband of high frequencies comprising in combination a transmission line having a first section and a second section joined together at a junction, said transmission line having a given characteristic conductance, a resistor coupled to the end of said first section and adapted to be coupled to a biasing source, a negative resistance diode adapted to exhibit a given absolute value of maximum negative conductance coupled to said transmission line at the junction of said first and second sections to comprise the active element of said amplifier, said resistor having a conductance magnitude greater than the maximum negative conductance of said diode for biasing said diode to exhibit said negative conductance, said first section of said transmission line having an electrical length substantially equal to one quarter of a wave-length at said predetermined frequency in said broad band of high frequencies, the combination of said resistor, said diode, and said second section of said transmission line having a conductance-frequency characteristic which exhibits to said first section of said transmission line a resultant negative conductance within said broadband of high frequencies and a resultant positive conductance outside of said broadband of high frequencies, said first section of said transmission line providing a tunable resonant circuit for said amplifier, and means coupling a signal source and a load circuit to said transmission line.

8. An amplifier tunable over a broadband of high frequencies comprising in combination a first transmission line and a second transmission line joined together at a junction, said first and second transmission lines having different characteristic conductances, a resistor coupled to the end of said second transmission line and adapted to be coupled to a biasing source, a negative resistance diode adapted to exhibit a given absolute value of maximum negative conductance coupled to said transmission lines at the junction of said first and second transmission lines to comprise the active element of said amplifier, said resistor having a conductance magnitude greater than the maximum negative conductance of said diode for biasing said diode to exhibit said negative conductance, said second transmission line having an electrical length substantially equal to one quarter of a wavelength in said broad band of high frequencies, the combination of said resistor, said diode, and said second transmission line having a conductance-frequency characteristic which exhibits to said first transmission line a resultant negative conductance within said broadband of high frequencies and a resultant positive conductance outside of said broadband of high frequencies, said first transmission line having an electrical length which provides a tuned resonant circuit for said amplifier, means for changing the frequency of resonance of said amplifier to tune said amplifier throughout said broadband of frequencies, a source of signals to be amplified, said signal source having a given positive conductance, a load circuit having a given positive conductance, and means coupling said signal source and said load circuit to said transmission line, the sum of said signal source and load circuit positive conductances being greater than the resultant negative conductance of said amplifier throughout said broadband of high frequencies.

9. An electrical circuit comprising in combination, a current-controlled negative resistance diode, biasing circuit means for said diode including a stabilizing resistor, and a quarter-wave transmission line impedance transformer coupled between said diode and said resistor, said impedance transformer and said resistor exhibiting to said diode a resistance-frequency characteristic providing a resultant positive resistance that is less than the absolute value of the negative resistance of said diode for a band of frequencies in the operating frequency range of said circuit and a resultant positive resistance which is greater than the absolute value of the negative resistance of said diode for frequencies outside said band of frequencies.

References Cited in the file of this patent

UNITED STATES PATENTS

| | | |
|---|---|---|
| 2,274,347 | Rust | Feb. 24, 1942 |
| 2,469,569 | Ohl | May 10, 1949 |
| 2,522,402 | Robertson | Sept. 12, 1950 |
| 2,777,906 | Shockley | Jan. 15, 1957 |
| 2,806,138 | Hopper | Sept. 10, 1957 |

OTHER REFERENCES

Sommers: "Tunnel Diodes as High-Frequency Devices," Proc. IRE, July 1959, pages 1201–1206.

Chang: "Low-Noise Tunnel-Diode Amplifier," Proc. IRE, July 1959, pages 1268, 1269.